US012266550B2

(12) United States Patent
Pathak et al.

(10) Patent No.: US 12,266,550 B2
(45) Date of Patent: Apr. 1, 2025

(54) MULTIPLE PROCESS SEMICONDUCTOR PROCESSING SYSTEM

(71) Applicant: Applied Materials, Inc., Santa Clara, CA (US)

(72) Inventors: Nitin Pathak, Mumbai (IN); Vinay K. Prabhakar, Cupertino, CA (US); Badri N. Ramamurthi, Los Gatos, CA (US); Viren Kalsekar, Mountain View, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 239 days.

(21) Appl. No.: 16/932,795

(22) Filed: Jul. 19, 2020

(65) Prior Publication Data

US 2022/0020615 A1 Jan. 20, 2022

(51) Int. Cl.
*H01L 21/67* (2006.01)
*H01J 37/32* (2006.01)
*H01L 21/677* (2006.01)

(52) U.S. Cl.
CPC .. *H01L 21/67196* (2013.01); *H01J 37/32357* (2013.01); *H01J 37/32715* (2013.01);
(Continued)

(58) Field of Classification Search
CPC ......... H01L 21/67196; H01L 21/67017; H01L 21/67167; H01L 21/67751; H01L 21/6719;
(Continued)

(56) References Cited

U.S. PATENT DOCUMENTS 10,134,587 B1 * 11/2018 Mizuguchi .......... H01L 21/0228
10,370,763 B2 * 8/2019 Hirano .............. H01J 37/32192
(Continued)

FOREIGN PATENT DOCUMENTS

CN 1900359 A * 1/2007 .......... C23C 14/568
CN 107078090 A * 8/2017 ......... H01L 21/6838
(Continued)

OTHER PUBLICATIONS

International Search Report and Written Opinion mailed Oct. 27, 2021 in International Patent Application No. PCT/US2021/040870, 9 pages.
(Continued)

*Primary Examiner* — Mohammed Shamsuzzaman
(74) *Attorney, Agent, or Firm* — Kilpatrick Townsend & Stockton LLP

(57) ABSTRACT

Exemplary substrate processing systems may include a plurality of processing regions. The systems may include a transfer region housing defining a transfer region fluidly coupled with the plurality of processing regions. The systems may include a plurality of substrate supports. Each substrate support of the plurality of substrate supports may be vertically translatable between the transfer region and an associated processing region of the plurality of processing regions. The systems may include a transfer apparatus including a rotatable shaft extending through the transfer region housing. The transfer apparatus may also include an end effector coupled with the rotatable shaft. The systems may include an exhaust foreline including a plurality of foreline tails. Each foreline tail of the plurality of foreline tails may be fluidly coupled with a separate processing region of the plurality of processing regions. The systems may include a plurality of throttle valves.

12 Claims, 6 Drawing Sheets

(52) U.S. Cl.
CPC .. *H01J 37/32743* (2013.01); *H01J 37/32834* (2013.01); *H01J 37/32899* (2013.01); *H01L 21/67017* (2013.01); *H01L 21/67167* (2013.01); *H01L 21/67751* (2013.01)

(58) Field of Classification Search
CPC .......... H01L 21/67742; H01L 21/68771; H01J 37/32357; H01J 37/32715; H01J 37/32743; H01J 37/32834; H01J 37/32899; H01J 37/32889; H01J 37/32449
See application file for complete search history.

(56) References Cited

U.S. PATENT DOCUMENTS

| | | | |
|---|---|---|---|
| 2003/0101938 A1* | 6/2003 | Ronsse | C23C 16/4401 118/712 |
| 2003/0213560 A1* | 11/2003 | Wang | H01L 21/67196 156/345.31 |
| 2007/0095286 A1* | 5/2007 | Baek | C23C 16/45574 427/248.1 |
| 2009/0324826 A1* | 12/2009 | Kato | C23C 16/45551 427/255.28 |
| 2010/0288369 A1 | 11/2010 | Chang et al. | |
| 2013/0269609 A1* | 10/2013 | Leeser | H01L 21/6719 118/719 |
| 2014/0261168 A1 | 9/2014 | Liang et al. | |
| 2016/0068953 A1* | 3/2016 | Li | C23C 16/45519 118/712 |
| 2016/0211122 A1* | 7/2016 | Liehr | H01J 37/32899 |
| 2017/0069473 A1* | 3/2017 | Saito | H01L 43/10 |
| 2017/0294319 A1* | 10/2017 | Ogiwara | H01L 21/67069 |
| 2017/0321325 A1* | 11/2017 | Sato | C23C 16/458 |
| 2018/0032062 A1* | 2/2018 | Trussell | H01L 21/67167 |
| 2018/0033674 A1* | 2/2018 | Jeong | H01L 21/68771 |
| 2019/0067006 A1* | 2/2019 | Hawrylchak | H01L 21/68785 |
| 2019/0131167 A1 | 5/2019 | Rice et al. | |
| 2019/0136994 A1* | 5/2019 | Nakasato | F16K 51/02 |
| 2020/0102651 A1* | 4/2020 | Kashyap | C23C 16/4584 |
| 2020/0203197 A1 | 6/2020 | Tan et al. | |
| 2021/0032747 A1* | 2/2021 | Pathak | H01J 37/32449 |
| 2021/0202218 A1* | 7/2021 | Parimi | H01L 21/02274 |
| 2021/0320017 A1* | 10/2021 | Pathak | H01L 21/67017 |
| 2021/0320018 A1* | 10/2021 | Chandrasekar | H01L 21/67098 |
| 2021/0335635 A1* | 10/2021 | Kalsekar | H01L 21/67772 |
| 2022/0013383 A1* | 1/2022 | Savandaiah | C23C 14/568 |
| 2022/0028710 A1* | 1/2022 | Subramani | H01L 21/68771 |
| 2022/0122870 A1* | 4/2022 | Parimi | H01L 21/6831 |
| 2022/0130649 A1* | 4/2022 | Kalsekar | H01J 37/32743 |
| 2022/0307131 A1* | 9/2022 | Subramani | H01J 37/32348 |

FOREIGN PATENT DOCUMENTS

| | | | | |
|---|---|---|---|---|
| DE | 102013107659 B4 | * | 3/2015 | ............. C23C 14/35 |
| JP | 2011134996 A | * | 7/2011 | ....... C23C 16/45538 |
| KR | 100558922 B1 | | 3/2006 | |
| KR | 100782529 B1 | | 12/2007 | |
| KR | 20130116218 A | | 10/2013 | |
| KR | 101796647 B1 | | 11/2017 | |
| KR | 20180013034 A | | 2/2018 | |
| KR | 2019-0074481 A | | 6/2019 | |
| KR | 20200062360 A | | 6/2020 | |
| TW | 200939335 A | | 9/2009 | |
| TW | 201837969 A | | 10/2018 | |
| TW | 202135166 A | * | 9/2021 | ........... C23C 16/045 |
| WO | WO-2007142850 A2 | * | 12/2007 | ....... C23C 16/45557 |
| WO | WO-2015007653 A1 | * | 1/2015 | ............. C23C 14/35 |
| WO | WO-2018075225 A1 | * | 4/2018 | ....... G02F 1/133502 |

OTHER PUBLICATIONS

Application No. PCT/US2021/040870, International Preliminary Report on Patentability, Mailed On Feb. 2, 2023, 8 pages.
Application No. KR10-2023-7005566, Notice of Decision to Grant, Mailed On Jan. 6, 2025, 4 pages.

* cited by examiner

MULTIPLE PROCESS SEMICONDUCTOR PROCESSING SYSTEM

TECHNICAL FIELD

The present technology relates to semiconductor processes and equipment. More specifically, the present technology relates to semiconductor processing systems having multiple processing regions.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Some processing systems may include multiple processing regions and transfer regions connected together. Depending on the layout and configuration of the components, different regions may be fluidly accessible for precursors delivered through the system. When deposition and cleaning precursors, including plasma-enhanced species of the precursors, may access regions of the system, deposition or damage may occur within the system. Additionally, particular layouts and flow patterns may limit pressure differentials between different processing regions, which may limit the types of processes that may be performed concurrently, and which may challenge exhausting of different regions of the system.

Thus, there is a need for improved systems and components that can be used to efficiently flow and exhaust materials within semiconductor processing chambers and systems. These and other needs are addressed by the present technology.

SUMMARY

Exemplary substrate processing systems may include a plurality of processing regions. The systems may include a transfer region housing defining a transfer region fluidly coupled with the plurality of processing regions. The systems may include a plurality of substrate supports. Each substrate support of the plurality of substrate supports may be vertically translatable between the transfer region and an associated processing region of the plurality of processing regions. The systems may include a transfer apparatus including a rotatable shaft extending through the transfer region housing. The transfer apparatus may also include an end effector coupled with the rotatable shaft. The systems may include an exhaust foreline including a plurality of foreline tails. Each foreline tail of the plurality of foreline tails may be fluidly coupled with a separate processing region of the plurality of processing regions. The systems may include a plurality of throttle valves. A throttle valve of the plurality of throttle valves may be incorporated in each foreline tail of the plurality of foreline tails.

In some embodiments, the systems may include a plurality of purge channels extending about each substrate support of the plurality of substrate supports. Each purge channel of the plurality of purge channels may extend through the transfer region housing proximate a substrate support of the plurality of substrate supports. Each processing region of the plurality of processing regions may be at least partially defined from above by a separate lid stack. Each lid stack may include a pumping liner fluidly coupled with an exhaust of the substrate processing system. Each pumping liner may at least partially define an exhaust flow path from each processing region for a purge gas delivered through the plurality of purge channels. The systems may include a choking liner extending from each substrate support of the plurality of substrate supports. Each choking liner may define a plurality of apertures providing fluid communication between an associated processing region and the transfer region when the substrate support is in a raised position for processing. The plurality of substrate supports may include at least three substrate supports distributed about the transfer region. The transfer apparatus may be centrally located between the plurality of substrate supports.

Some embodiments of the present technology may encompass methods of semiconductor processing. The methods may include delivering one or more processing precursors through a plurality of lid stacks of a substrate processing system. Each lid stack of the plurality of lid stacks fluidly accessing a processing region of a plurality of processing regions. Each processing region of the plurality of processing regions may be at least partially defined by a lid stack of the plurality of lid stacks and a substrate support of a plurality of substrate supports. The methods may include forming a pressure differential between two processing regions of the plurality of processing regions. The methods may include delivering a purge gas into a transfer region of the substrate processing system through a plurality of purge channels extending through a transfer region housing defining the transfer region. The transfer region may be fluidly coupled with each processing region of the plurality of processing regions. The methods may include exhausting the processing precursors and the purge gas through a pumping liner of each lid stack of the plurality of lid stacks.

In some embodiments, the pressure differential may be greater than or about 10 Torr between the two processing regions of the plurality of processing regions. The substrate processing system may include a transfer apparatus positioned in the transfer region. The transfer apparatus may include a rotatable shaft extending through the transfer region housing. An end effector may be coupled with the rotatable shaft. The end effector may include a central hub defining a central aperture fluidly coupled with a purge source. The end effector may also include a plurality of arms having a number of arms equal to a number of substrate supports of the plurality of substrate supports. The delivering may include delivering a first precursor to a first processing region of the two processing regions of the plurality of processing regions. The methods may include delivering a second precursor to a second processing region of the two processing regions of the plurality of processing regions. The first precursor or the second precursor may be a deposition precursor.

Each substrate support of the plurality of substrate supports may also include a choking liner extending from each substrate support towards the transfer region of the substrate processing system. Each choking liner may define a plurality of apertures providing fluid communication between the processing region and transfer region when the substrate support is in a raised position for processing. The purge gas may be delivered from the transfer region through the plurality of apertures defined in the choking liner. The substrate processing system may include a system foreline including a plurality of foreline tails. Each foreline tail of the plurality of foreline tails may be fluidly coupled with a separate processing region of the plurality of processing regions. The substrate processing system may include a plurality of throttle valves. A throttle valve of the plurality of throttle valves may be incorporated in each foreline tail of the plurality of foreline tails. The methods may include modulating a first throttle valve of the plurality of throttle valves separately from a second throttle valve of the plurality of throttle valves to maintain the pressure differential between the two processing regions of the plurality of processing regions. The one or more processing precursors may be limited or prevented from flowing into the transfer region of the substrate processing system by the purge gas.

Such technology may provide numerous benefits over conventional systems and techniques. For example, the purge channels may limit or prevent processing precursors from entering a transfer region within the system. Additionally, the systems may facilitate having different processes performed within different processing regions within the system. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
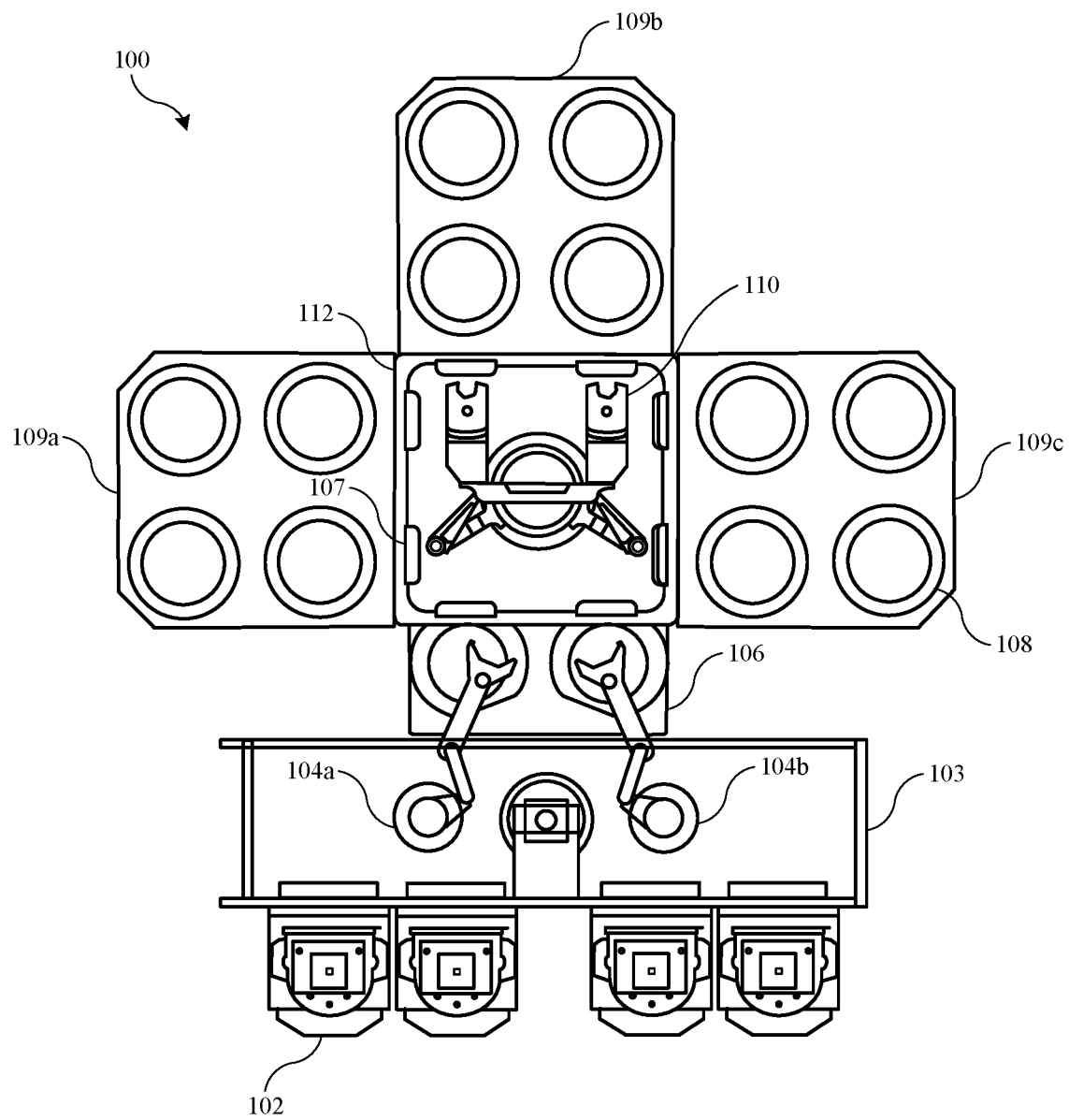
FIG. 1A shows a schematic top view of an exemplary processing tool according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. A substrate support may then vertically translate between the transfer region and the processing region to deliver a substrate for processing.

When transfer regions are fluidly accessible to processing regions, process gases or plasma-enhanced species may permeate through a processing region and enter into the transfer region. These active precursors, which may include deposition precursors, cleaning gases, or other materials, may cause deposition or other process interactions to occur within the transfer region, and may cause deposition or damage to occur on transfer region components. The present technology may overcome these issues by delivering one or more purge gases into the transfer region to help limit or prevent processing precursors from entering the transfer region. Additionally, by utilizing these purge gases and controlling their flow and incorporating additional system components, the present technology may allow different processes to be performed within the various processing regions of the system, which may increase the functionality of systems according to some embodiments of the present technology.

Although the remaining disclosure will routinely identify specific structures, such as four-position transfer regions, for which the present structures and methods may be employed, it will be readily understood that the substrate processing systems or components may be equally employed in any number of other systems or chambers. Accordingly, the technology should not be considered to be so limited as for use with any particular chambers alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
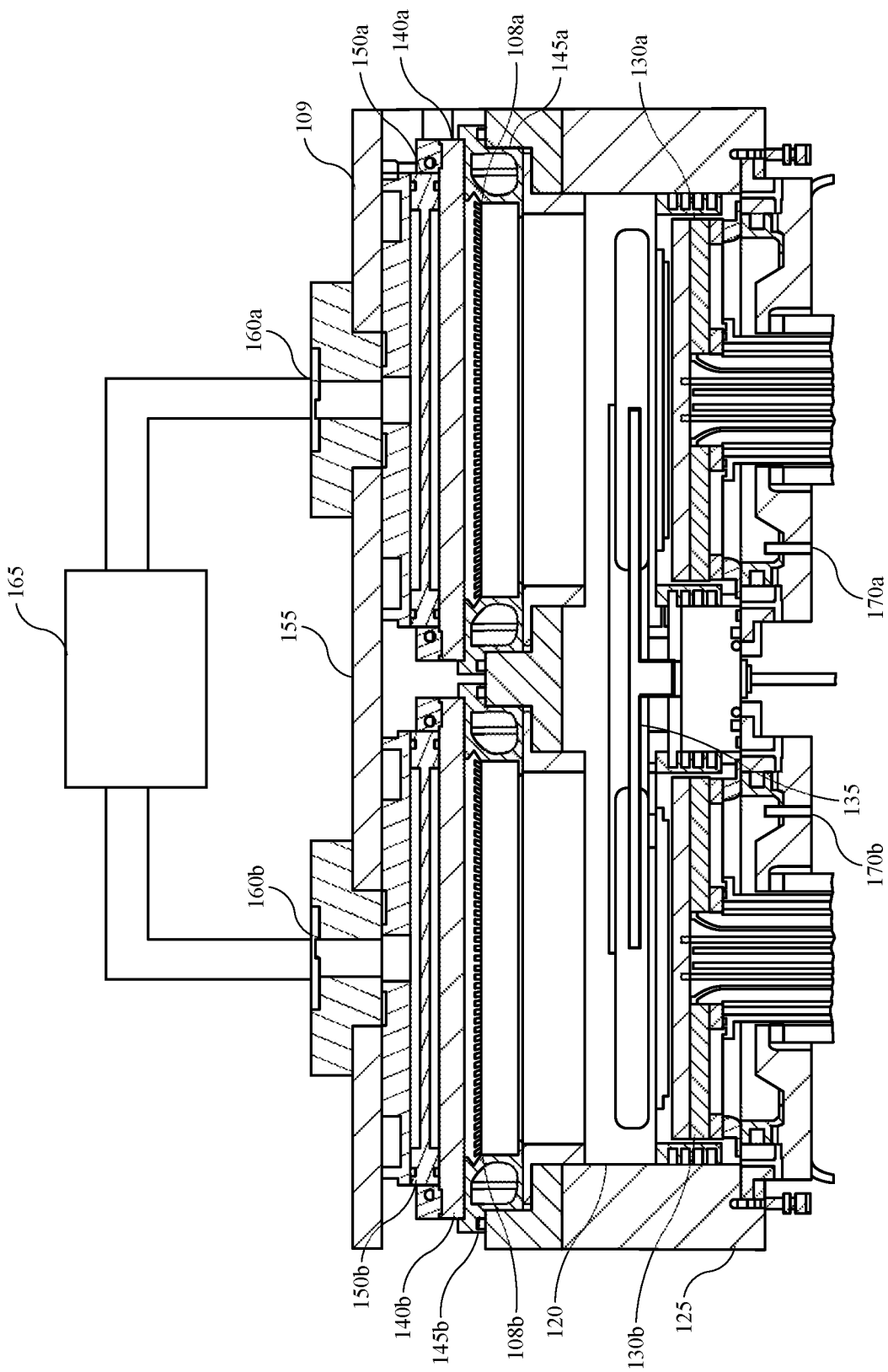
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. In some embodiments, such as illustrated, lid 155 may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support, and a number of purge channels may be distributed around each substrate support in some embodiments. With the two substrate supports 130 illustrated, a first purge channel 170a may extend through the housing proximate substrate support 130a, and a second purge channel 170b may extend through the housing proximate substrate support 130b. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170b may be exhausted from the processing system from pumping liner 145b. As will be explained further below, the flow of the purge gases may be delivered to limit intrusion of processing precursors into the transfer region of the system. Additionally, to limit accumulation of processing precursors in central regions between the various processing regions, additional purge gas may be flowed through and around the transfer apparatus 135 in some embodiments of the present technology.

Figure 2:
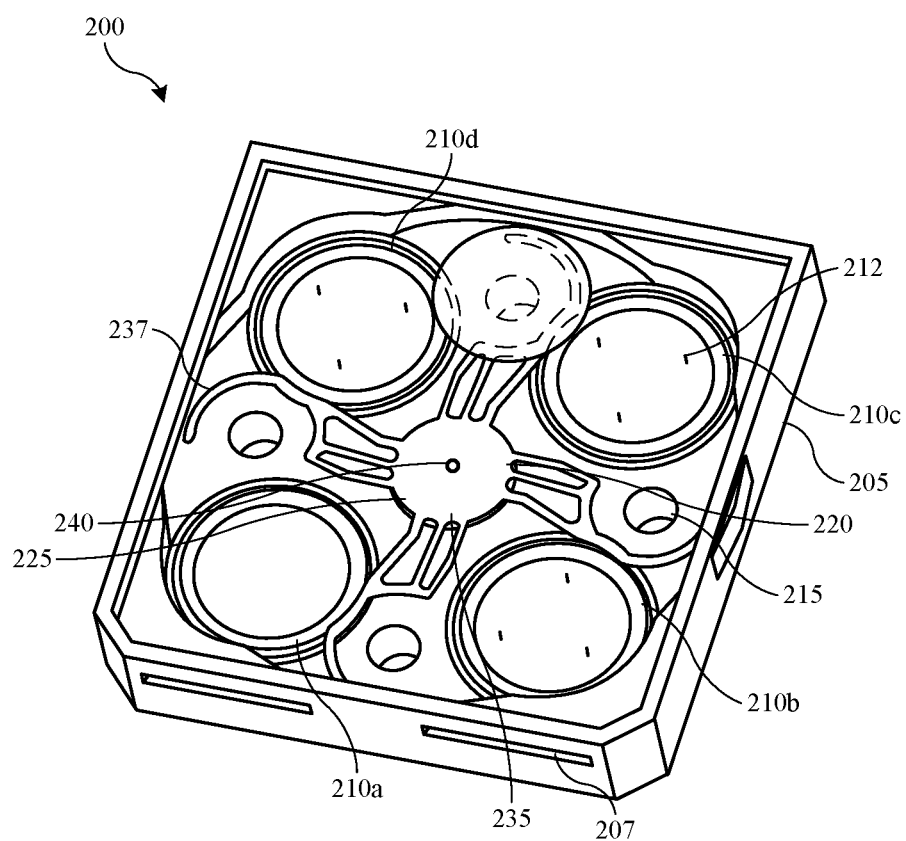
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG.

1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

As noted above, in some embodiments a central purge may be included within the processing region. For example, when each of the four substrate supports 210 include a purge channel proximate the stem and extending through the transfer chamber housing, the flows may not extend over central hub 225. Consequently, processing precursors that may flow to this region may accumulate and not purge from the transfer region. To limit or prevent this effect, in some embodiments the present technology may deliver an additional purge through and/or about the transfer apparatus. A flow may extend from beneath the end effector as will be described below, and a flow may also extend through a central aperture 240 defined through the central hub. The aperture may provide fluid access into the transfer region from a shaft, such as a rotatable shaft, of the transfer apparatus with which the end effector may be coupled. A purge source may be fluidly coupled with the shaft to provide a purge path through the central aperture.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
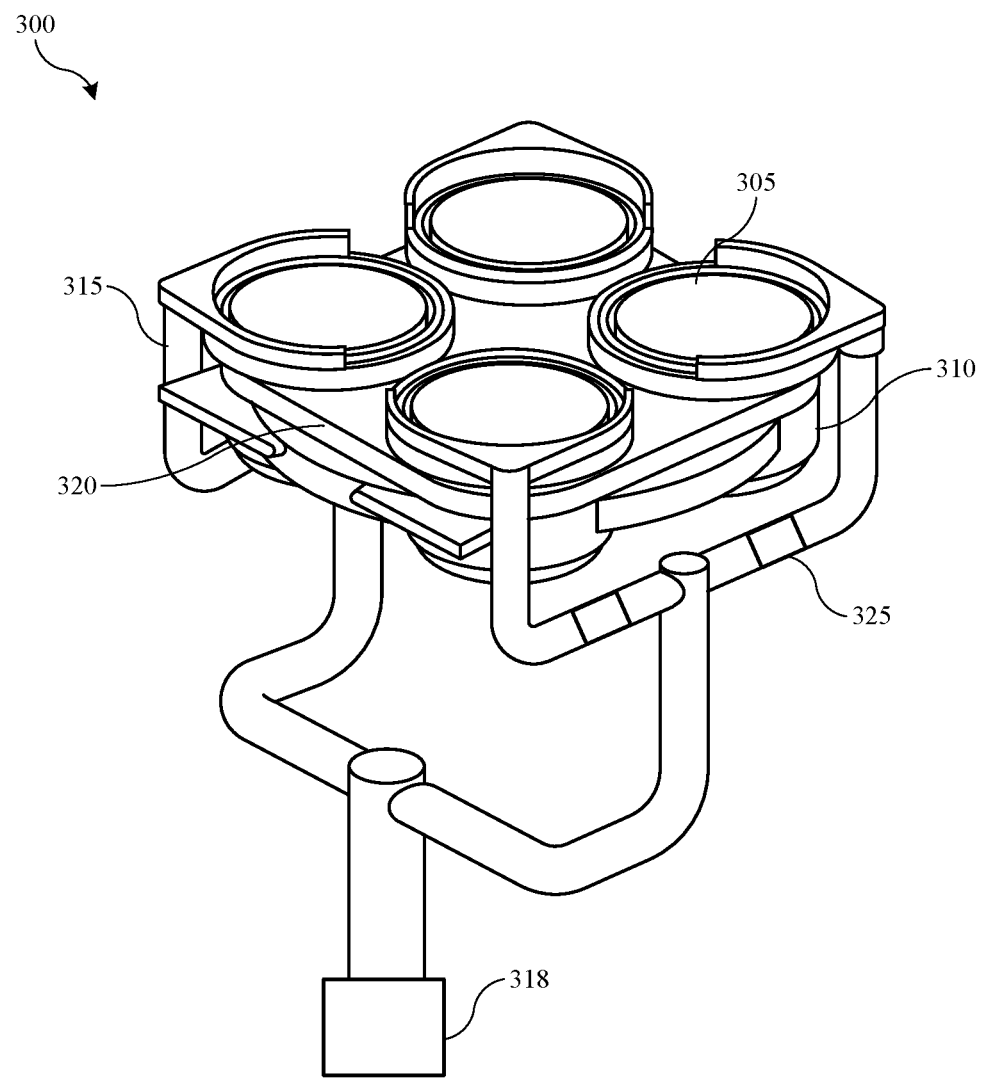
FIG. 3 shows a schematic isometric view of an exemplary exhaust system of an exemplary substrate processing system according to some embodiments of the present technology.

FIG. 3 shows a schematic isometric view of an exemplary exhaust system 300 of an exemplary substrate processing system according to some embodiments of the present technology. The figure may illustrate aspects of the processing systems and components described above, and may illustrate additional aspects of the system. The figure may illustrate the system with a number of components removed to facilitate illustration of an exhaust system of the processing system. It is to be understood that exhaust system 300 may include any aspect of any portion of the processing systems described or illustrated elsewhere, and may illustrate aspects of an exhaust system incorporated with any of the systems described elsewhere. For example, exhaust system 300 may illustrate a system with some of the previously described lid stack components removed. It is to be understood that the components may still be incorporated, such as including a pumping liner at each processing location.

As noted previously, processing systems according to some embodiments of the present technology may include substrate supports 305 that may be vertically translated from a transfer region 310, which may include any aspect of chamber section 200 described above. The substrate supports 305 may each extend to an associated processing region where they may at least partially define the processing region from below, with a faceplate or other lid stack components at least partially defining the processing region from above. The pumping liners may at least partially define the processing regions radially, and may provide an exhaust path as described above, which may deliver materials to an exhaust system, such as shown in the figure. Each pumping liner may provide access to a foreline tail 315, which may lead to a foreline. The foreline may fluidly couple each of the foreline tails 315 with a pumping system 318 configured to draw materials from the system. As illustrated, each foreline tail 315 may couple with a separate processing region at an exterior location as illustrated, although the pumping lines may be connected at any number of locations in embodiments for a radially drawing pumping liner as previously described.

As illustrated, the foreline tails 315 may be the only exhaust paths from the processing system including from transfer region 310. Additionally, as shown, substrate supports 305 may not fully seat or seal with lid stack components, such as a lower lid plate 320 that may support the individual lid stack components, and may at least partially define processing regions about the substrate supports. Lower lid plate 320 may also define the transfer region from above. Consequently, each processing region may then be fluidly coupled with the transfer region about the substrate supports. When purge gas is flowed from the purge channels proximate the substrate supports, the gas may then be drawn up to the pumping liners about the substrate supports and through the lower lid plate, before flowing through the pumping liners and into the exhaust system. Thus, the pumping liners may define an exhaust flow path from each processing region for both processing precursors, which may be delivered from above the pumping liners, as well as purge gases, which may be delivered from the transfer region and below the pumping liners.

When each processing region is performing a similar operation, which may include delivering similar amounts of purge gas from the processing region about each substrate support, the central region illustrated may not have much flow across the region, as purge gas may generally flow upwards to an associated processing region, and may not flow across or between the substrate supports. To limit accumulation of processing materials or precursors within the transfer region, an additional purge flow may be delivered into the transfer region centrally as discussed above for some embodiments of the present technology.

In some embodiments as will be discussed further below, systems according to the present technology may be used to perform different processes within the different processing regions, and these different processes may be performed simultaneously. By flowing different precursors, such as deposition or etching precursors, a number of different processes may be performed in the various regions. By utilizing purge gases as described, intermixing of these gases in the transfer region, which could produce additional deposition material or etchants, and flow of these materials may be limited or prevented from interacting with one another in the transfer region. Additionally, by including one or more additional components or flow controls, the range of processes that may be performed simultaneously may be further increased.

When separate processes are performed at relatively similar processing pressures, the system may remain balanced with similar purge flows at the separate regions, and a relatively similar exhaust rate. However, the present technology may also facilitate processing that may occur at different processing pressures within the various processing regions. A consideration during processing that may occur at different pressures is that the pressure through the exhaust system may not be equal or similar. Although multiple pumping systems may be incorporated in some embodiments, the present technology may include a throttle valve 325 in each foreline tail 315. By having throttle valves that may be independently controlled in some embodiments of the present technology, a single pumping system 318 may be utilized to operate as an exhaust pump for each processing region of the plurality of processing regions. By adjusting entering flow rates in the separate processing regions and operating the throttle valves independently, processes occurring at different processing pressures may be performed simultaneously in different processing regions.

The different flow rates of precursors that may be used to maintain different pressures within different processing regions may impact the likelihood of precursor or effluent flow into the transfer region of the processing system. Accordingly, in some embodiments the purge gas delivery systems may be decoupled as well, which may allow different purge rates to be delivered towards the different processing regions. For example, a processing region operating at a higher processing pressure may be accommodated by providing an increased purge gas flow delivered from the transfer region as previously described. The increased purge gas flow may act to block processing effluents, byproducts, or precursors from entering the transfer region, or may limit the intrusion.

Figure 4:
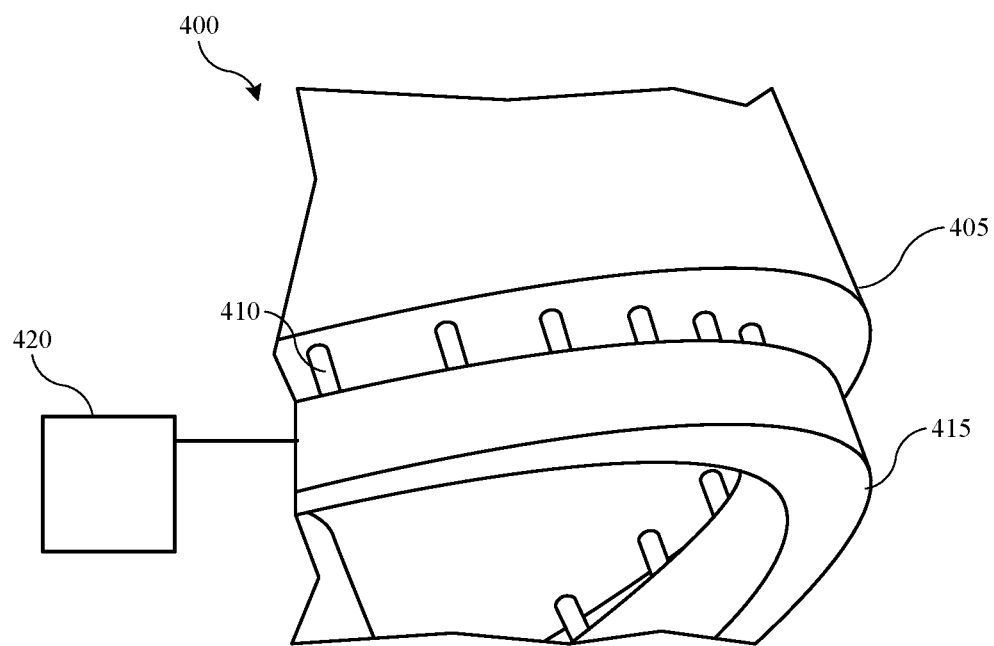
FIG. 4 shows a schematic partial isometric view of a purge gas delivery system according to some embodiments of the present technology.

As illustrated previously, exhaust may be drawn radially outward from the processing region into a plenum formed in the pumping liner. The materials may then be drawn into the associated foreline tail at an edge of the pumping liner. Delivering purge gases may also be performed to ensure a substantially equal distribution radially about a substrate support, which may ensure a more uniform effect on the processing precursors, and which may limit an impact on the substrate being processed. FIG. 4 shows a schematic partial isometric view of a purge gas delivery system 400 according to some embodiments of the present technology. The illustration may show beneath a transfer region housing 405, which may include any aspect of transfer region housing 125 described above. The view may show one section of the transfer region housing, which may be at one substrate support region within the transfer region. The figure may illustrate a portion of the system about one substrate support, although it is to be understood that the components may be included with or about any substrate support or individual processing region of the system. Similar to purge channels 170 described above, purge channels 410 may extend about the substrate support pedestal, and may extend through the transfer region housing near the substrate support, such as radially outward of a platen portion of the substrate support.

In some embodiments the purge channels may be fed from a plenum 415, which may facilitate delivery to the plurality of purge channels surrounding each substrate support. For example, a plenum may be formed about each set of purge channels around each substrate support. A purge source 420, such as an inert or non-reactive gas source, may be fluidly coupled with each plenum in some embodiments. For example, a separately controllable source may be coupled with each plenum, which may allow different purge gas flow rates to be delivered about each separate substrate support. For example, for higher pressure processing, a greater flow rate of purge gas may be delivered through the purge channels 410 to counter increased pressure from the processing region. To further control fluid flow between the processing region and the transfer region, in some embodiments a choking liner may be incorporated between each processing region and the transfer region.

Figure 5:
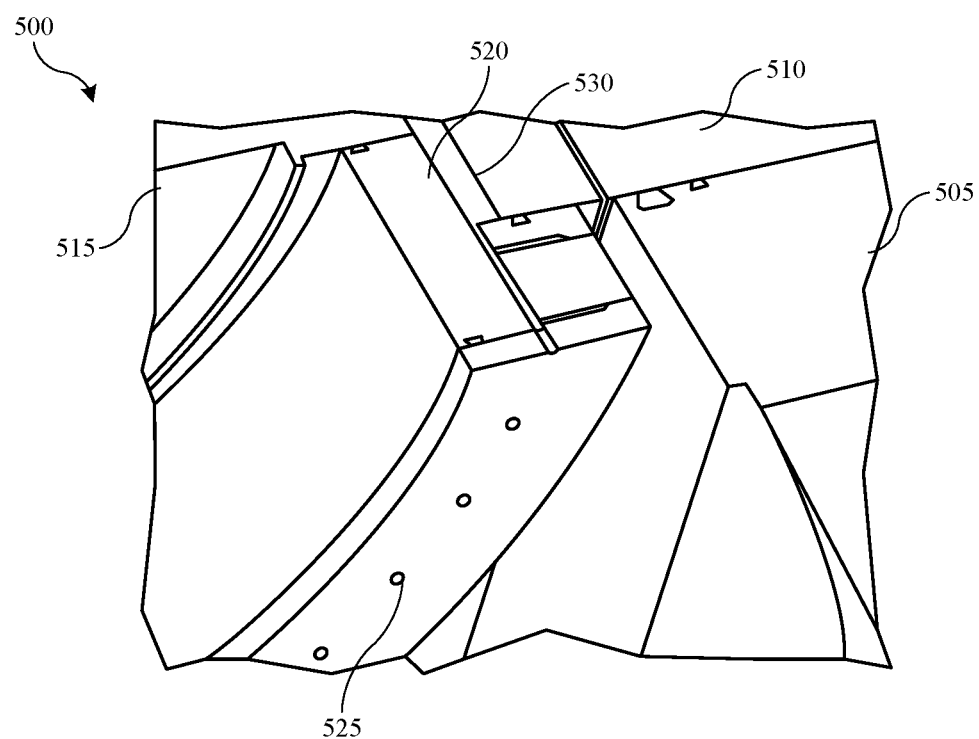
FIG. 5 shows a schematic partial cross-sectional view of a processing system according to some embodiments of the present technology.

FIG. 5 shows a schematic partial cross-sectional view of a processing system 500 according to some embodiments of the present technology. Processing system 500 may include any feature, component, or aspect of any system described previously, and may illustrate additional features that can be incorporated with any system according to embodiments of the present technology. The figure may illustrate a portion of the system about one substrate support, although it is to be understood that the components may be included with any substrate support or individual processing region of the system. System 500 may include a transfer region housing 505, and a lid plate 510, which may be seated on the transfer region housing and may define the individual processing regions. These components may be the same as the structural components as previously described. Substrate support 515 may extend into or through the lid plate from the transfer region towards an overlying lid stack as previously described for the processing region.

As described above, in some embodiments additional flow components may be incorporated with the system to further limit ingress of processing materials into the transfer region. For example, in some embodiments a choking liner 520 may be seated on each substrate support, and may extend vertically from the substrate support towards the transfer region. The choking liner may seat on the substrate support at a proximal end, and may extend radially outward at a distal end. The outward extension may then seat against lid plate 510 when the substrate support is raised into an operational position. The choking liner may contact the lid plate as illustrated to block additional flow between the processing region and the transfer region. As shown, choking liner 520 may define a plurality of apertures 525 through the radial outward extension, which may provide fluid communication between the associated processing region and the transfer region when the choking liner is engaged against the lid plate. The apertures 525 may extend radially about the substrate support to allow a uniform flow through the choking liner. The apertures may be sized to provide any amount of choke, which may be based on any fluid flow or pressure within the system. For example, the apertures may be sized to be less than or about 10 mm, and may be less than or about 9 mm, less than or about 8 mm, less than or about 7 mm, less than or about 6 mm, less than or about 5 mm, less than or about 4 mm, less than or about 3 mm, less than or about 2 mm, less than or about 1 mm, or less.

A gap 530 may be formed between the substrate support and the lid plate to limit turbulence or other eddy current formation for purge gas flowing up from the transfer region. The gap may expand the space between the choking liner and the lid stack at the proximal region of the choking liner near the pumping liner of the lid stack. Gap 530 may be any size, and may be at least equal to a diameter of the apertures 525 formed through the choking liner. In some embodiments, gap 530 may be at least about 1.5 times the diameter of apertures 525, and may be at least about 2.0 times the diameter, at least about 2.5 times the diameter, at least about 3.0 times the diameter, at least about 3.5 times the diameter, at least about 4.0 times the diameter, at least about 4.5 times the diameter, at least about 5.0 times the diameter, or larger. By incorporating a choking liner, different purge flows may be more readily controlled between the multiple processing regions when operating different processes within the regions.

Figure 6:
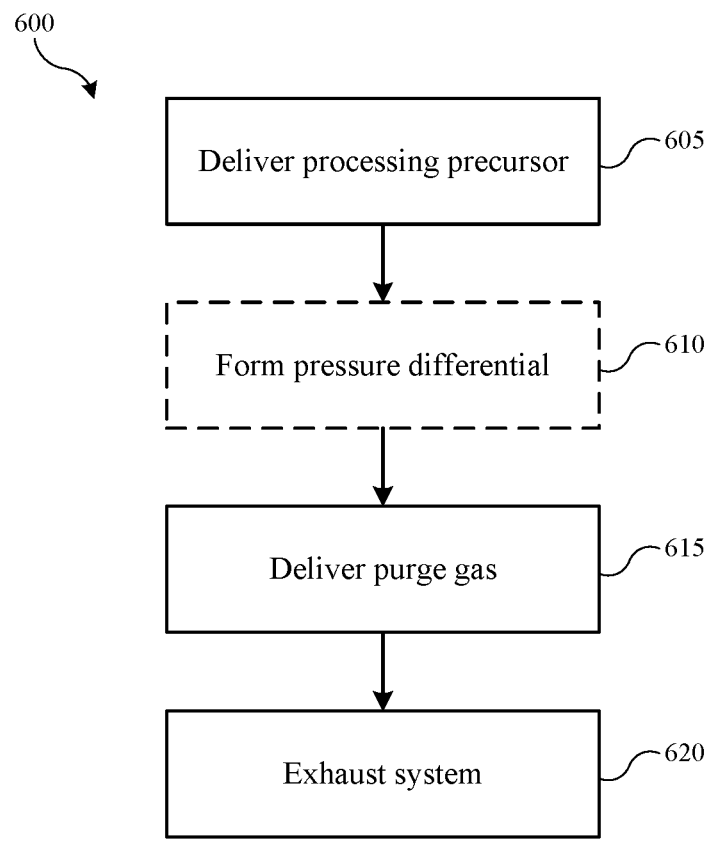
FIG. 6 shows selected operations in a method of semiconductor processing according to some embodiments of the present technology.

The systems described above may be used to perform semiconductor processing, and in some embodiments may be used to perform multiple and differing processes simultaneously. FIG. 6 shows selected operations in a method 600 of semiconductor processing according to some embodiments of the present technology. The method may be performed in a variety of processing systems, including processing system 100 described above, which may include any of the features or components described throughout the present disclosure. The method may include performing a purge operation within a transfer region of the processing system during semiconductor processing or chamber cleaning, which may limit materials from accumulating within the transfer region as previously described. Method 600 may include a number of optional operations, which may or may not be specifically associated with some embodiments of methods according to the present technology. For example, many of the operations are described in order to provide a broader scope of the structural formation and operations performed, but are not critical to the technology, or may be performed by alternative methodology as would be readily appreciated. The methods may be performed in any processing chamber or system including any component, configuration, or aspect described above, including any aspect of the transfer apparatus or exhaust systems described above. The methods may also be performed in any other processing chambers that may benefit from purging according to embodiments of the present technology.

Method 600 may include additional operations prior to initiation of the listed operations. For example, additional processing operations may include delivering substrates into a transfer region, rotating substrates between substrate supports, and performing any amount of substrate processing within the processing system or any other processing chamber. A substrate support on which a substrate may be seated, such as within the transfer region, may be translated to a processing region, which may be overlying the transfer region as previously described. At operation 605, one or more processing precursors may be delivered to the processing region, which may include delivery to multiple processing regions, such as through individual lid stacks as described previously. As described above, each processing region may be at least partially defined by the associated lid stack, substrate support, and pumping liner through which processing and purge materials may be exhausted from the system.

In some embodiments different processing operations may be performed in different processing regions as previously noted. For example, a first process may be performed in a first chamber or a first set of chambers utilizing a first precursor or a first set of precursors, and a second process different from the first may be performed in a second chamber or a second set of chambers utilizing a second precursor or a second set of precursors. The processes may be characterized by any number of different aspects including any set of temperature, pressure, flow, and material conditions that may be similar or different between regions. It is to be understood that any number of different operations may be performed, and the following examples are not intended to limit the capabilities or processes encompassed by the present technology. For example, in some embodiments a first process may include a substrate pre-treatment operation, while a second process may include a deposition operation. Additionally, in some embodiments, the first process may include a first deposition operation, and the second process may include a different deposition operation. Such a process may allow formation of material stacks having a number of layers of material, such as memory stacks, for example, which may allow the formation to be performed by rotating substrates between the positions, which may dramatically reduce throughput compared to utilizing multiple chambers on a processing tool.

Because each processing region may be heated by a substrate support, temperatures from one processing region to the next may be readily modulated for any process. Pressure may also be modulated between processing regions, which may be accommodated by adjusting flow rates, purge gas delivery, and exhaust line throttling utilizing components according to embodiments of the present technology as previously described. For example, in some embodiments a choking liner as previously described may be incorporated with each processing region. Accordingly, in some embodiments a pressure differential may be produced between two processing regions at optional operation 610. For example, a first process may be performed at a first operating pressure that is less than or about 20 Torr, less than or about 15 Torr, less than or about 10 Torr, less than or about 5 Torr, or less. A second process performed simultaneously in an adjacent processing region, or additional processing region of the system, may be performed at a similar or different operating pressure. For example, the second process may be performed at a pressure of greater than or about 10 Torr, greater than or about 15 Torr, greater than or about 20 Torr, greater than or about 25 Torr, or higher. A differential between processing regions during simultaneous operation may be greater than or about 1 Torr, and may be greater than or about 5 Torr, greater than or about 10 Torr, greater than or about 15 Torr, greater than or about 20 Torr, or more.

At operation 615 one or more purge gases may be delivered into the transfer region extending below each processing region. The purge gas may be flowed through one or more purge channels, such as previously described, which may be positioned proximate each substrate support including surrounding the support, and may extend through the transfer region housing. Purge gas may additionally be provided through the rotatable shaft in some embodiments, which may deliver additional purge gas into the transfer region, such as through a central aperture defined by the central hub of the transfer apparatus. Additionally, purge gas may be delivered through a baffle at the bottom of the transfer region about the shaft of the transfer apparatus, or through apertures of the shaft of the transfer apparatus as previously described.

To provide the pressure differentials as noted above, flow rates of precursors being delivered may be adjusted. This may increase a diffusion potential from the processing region to the transfer region if a constant purge flow rate is provided at each station. Accordingly, in some embodiments the purge gas delivery may be adjusted between stations, where a higher purge gas flow rate may be provided at stations operating at higher pressure. Providing the varying purge gas rates may also ensure the processing precursors are limited or prevented from flowing into the transfer region of the substrate processing system. At operation 620, the processing system may be exhausted of the one or more processing precursors, byproducts of the processing, as well as the purge gas delivered through the transfer region. By exhausting the purge gas through the pumping liner and exhaust system as previously described, the purge gas may provide a barrier to limit or prevent processing precursors from accumulating within the transfer region. Because the exhaust flows may differ between regions depending on the processing being performed, in some embodiments the exhaust lines may include individual throttle valves as previously described, which may control flow to a central pumping system. A first throttle valve may be modulated separately from a second throttle valve, or each throttle valve of the system may be operated in groups or individually, to maintain the pressure differential during processing.

Purge gases may include any materials which may be inert or non-reactive with one or more components of the system, and may include nitrogen, argon, helium, hydrogen, oxygen, or any other process precursors or carrier gases, which may limit effects on the process being performed. Because the purge gas may be delivered to provide a barrier or curtain to limit flow of processing precursors from the processing region, a flow may be less than a flow of processing precursors. For example, in some embodiments the purge gas delivered from each of the purge channels may be delivered at less than or about 90% of the volume of flow of processing precursors being delivered through the associated lid stack. Additionally, the purge gas delivered may be less than or about 85% of the volume of flow of the processing precursors, and may be less than or about 80%, less than or about 75%, less than or about 70%, less than or about 65%, less than or about 60%, less than or about 55%, less than or about 50%, or less.

As explained previously, purge gas delivered above and below the transfer apparatus may be provided to prevent formation of dead zones where accumulation of processing materials may occur. To limit an effect of the delivery on balanced flow rates to each processing region, the amount of purge gas delivered centrally may be less than an amount delivered to any individual purge channel in some embodiments. For example, in some embodiments the purge gas delivered centrally through and/or about the transfer apparatus may be less than or about 80% of the volume delivered from any individual purge channel proximate an individual substrate support.

The volume of purge gas delivered about and/or through the transfer apparatus may be based at least in part on the volume of the transfer region, the volume of precursors being delivered through the lid stacks, as well as any other characteristics of the processing and chamber configuration. In some embodiments the total volume of purge gas delivered through and/or about the transfer apparatus shaft may be less than or about 20 slm, and may be less than or about 15 slm, less than or about 10 slm, less than or about 5 slm, less than or about 1 slm, less than or about 0.5 slm, less than or about 0.3 slm, or less. In some embodiments the delivery may be at a rate of less than or about 3 slm, which may limit thermal effects on the transfer apparatus, although higher flow rates may be provided during higher pressure processing operations. Because the transfer apparatus may provide flow paths for purge gas, a flow rate of the purge gas may be controlled to limit cooling along the arms or any aspect of the transfer apparatus in some embodiments. By providing purge gases through a transfer region of a processing system that may include one or more components according to some embodiments of the present technology, flow of process precursors may be limited or prevented from flowing into and/or accumulating within the transfer region, and varying processing conditions may be maintained in separate processing regions during multiple substrate processing operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a shaft" includes a plurality of such shafts, and reference to "the aperture" includes reference to one or more connectors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing comprising:
   delivering one or more processing precursors through a plurality of faceplates of a substrate processing system, each faceplate of the plurality of faceplates fluidly accessing a processing region of a plurality of processing regions, wherein each processing region of the plurality of processing regions is at least partially defined by a faceplate of the plurality of faceplates and comprise a substrate support of a plurality of substrate supports;
   adjusting a flow rate of the one or more processing precursors to form a pressure differential between two processing regions of the plurality of processing regions;
   delivering a purge gas into a plurality of transfer regions of the substrate processing system through a plurality of purge channels extending through a transfer region housing defining the plurality of transfer regions, wherein the plurality of transfer regions are fluidly coupled with a processing region of the plurality of processing regions and is disposed below each substrate support of the plurality of substrate supports when the plurality of substrate supports are positioned within the plurality of processing regions;
   adjusting a flow rate of the purge gas into one or more transfer regions of the plurality of transfer regions through a choking liner extending from each substrate support of the plurality of substrate supports towards the plurality of transfer regions of the substrate processing system, corresponding to a pressure of one or more processing regions of the plurality of processing regions; and
   exhausting the one or more processing precursors and the purge gas through a pumping liner seated below each faceplate of the plurality of faceplates.

2. The method of semiconductor processing of claim 1, wherein the pressure differential is greater than or about 10 Torr between the two processing regions of the plurality of processing regions.

3. The method of semiconductor processing of claim 1, wherein the substrate processing system comprises a transfer apparatus positioned in the plurality of transfer region, the transfer apparatus comprising:
   a rotatable shaft extending through the transfer region housing, and
   an end effector coupled with the rotatable shaft, wherein the end effector includes a central hub defining a central aperture fluidly coupled with a purge source, and wherein the end effector further includes a plurality of arms having a number of arms equal to a number of substrate supports of the plurality of substrate supports.

4. The method of semiconductor processing of claim 1, wherein the delivering comprises:
   delivering a first precursor to a first processing region of the two processing regions of the plurality of processing regions; and
   delivering a second precursor to a second processing region of the two processing regions of the plurality of processing regions.

5. The method of semiconductor processing of claim 4, wherein the first precursor or the second precursor is a deposition precursor.

6. The method of semiconductor processing of claim 1, wherein each choking liner defines a plurality of apertures providing fluid communication between the plurality of processing regions and the plurality of transfer regions when the substrate support is in a raised position for processing.

7. The method of semiconductor processing of claim 6, wherein the purge gas is delivered from the plurality of transfer regions through the plurality of apertures defined in the choking liner.

8. The method of semiconductor processing of claim 1, wherein the substrate processing system further comprises:
- a system foreline including a plurality of foreline tails, each foreline tail of the plurality of foreline tails fluidly coupling with a separate processing region of the plurality of processing regions.

9. The method of semiconductor processing of claim 8, wherein the substrate processing system further comprises:
- a plurality of throttle valves, wherein a throttle valve of the plurality of throttle valves is incorporated in each foreline tail of the plurality of foreline tails.

10. The method of semiconductor processing of claim 9, further comprising:
- modulating a first throttle valve of the plurality of throttle valves separately from a second throttle valve of the plurality of throttle valves to maintain the pressure differential between the two processing regions of the plurality of processing regions.

11. The method of semiconductor processing of claim 1, wherein the one or more processing precursors are limited or prevented from flowing into the plurality of transfer regions of the substrate processing system by the purge gas.

12. The method of semiconductor processing of claim 1, wherein the plurality of transfer regions extends below each processing region.

* * * * *